(12) United States Patent
Huang et al.

(10) Patent No.: US 7,804,690 B2
(45) Date of Patent: Sep. 28, 2010

(54) SERVER DEVICE

(75) Inventors: Ying-Hui Huang, Hsinchu (TW);
Tien-Hsiung Tung, Hsinchu (TW);
Pao-Kang Mo, Hsinchu (TW); Te-Wei Liu, Hsinchu (TW)

(73) Assignee: Alpha Networks Inc., Hsinchu (TW)

( * ) Notice: Subject to any disclaimer, the term of this patent is extended or adjusted under 35 U.S.C. 154(b) by 150 days.

(21) Appl. No.: 12/155,786

(22) Filed: Jun. 10, 2008

(65) Prior Publication Data

US 2009/0190301 A1    Jul. 30, 2009

(30) Foreign Application Priority Data

Jan. 24, 2008    (TW) ............... 97201528 U

(51) Int. Cl.
*H05K 7/20* (2006.01)
*H05K 5/00* (2006.01)
*G06F 1/20* (2006.01)
*A47B 81/00* (2006.01)

(52) U.S. Cl. ............... 361/724; 361/752; 361/679.46; 361/679.48; 454/184; 312/223.2

(58) Field of Classification Search ............... 361/724, 361/679.46, 679.48; 454/184
See application file for complete search history.

(56) References Cited

U.S. PATENT DOCUMENTS

| | | | | |
|---|---|---|---|---|
| 3,413,050 A | * | 11/1968 | Sommers et al. | 312/107 |
| 4,014,598 A | * | 3/1977 | Stalley et al. | 312/236 |
| 4,156,794 A | * | 5/1979 | Robinson | 174/16.1 |
| 4,238,139 A | * | 12/1980 | Suzuki et al. | 312/7.1 |
| 4,728,160 A | * | 3/1988 | Mondor et al. | 312/236 |
| 4,744,005 A | * | 5/1988 | Milani | 361/679.48 |
| 4,909,579 A | * | 3/1990 | Liu | 312/223.2 |
| 4,926,291 A | * | 5/1990 | Sarraf | 361/679.36 |
| 5,168,171 A | * | 12/1992 | Tracewell | 307/64 |
| 5,460,441 A | * | 10/1995 | Hastings et al. | 312/298 |
| 5,576,931 A | * | 11/1996 | Crane et al. | 361/679.5 |
| 5,638,259 A | * | 6/1997 | McCarthy et al. | 361/800 |
| 5,751,549 A | * | 5/1998 | Eberhardt et al. | 361/679.33 |
| 5,761,033 A | * | 6/1998 | Wilhelm | 361/679.33 |
| 5,788,467 A | * | 8/1998 | Zenitani et al. | 417/360 |
| 5,845,978 A | * | 12/1998 | Jung | 312/244 |
| 5,931,550 A | * | 8/1999 | Chen | 312/244 |
| 5,949,645 A | * | 9/1999 | Aziz et al. | 361/695 |
| 6,025,989 A | * | 2/2000 | Ayd et al. | 361/695 |
| 6,129,429 A | * | 10/2000 | Hardt et al. | 312/223.2 |

(Continued)

*Primary Examiner*—Jayprakash N Gandhi
*Assistant Examiner*—Bradley H Thomas
(74) *Attorney, Agent, or Firm*—Bacon & Thomas, PLLC

(57) ABSTRACT

The present invention relates to a server device which comprises a case having two symmetric slots disposed on the top and a first handle disposed in each of the slots to make it easier to lift up the server device, a horizontal partition disposed in the case and dividing the inner space of the case into upper and lower parts, wherein the upper part is a first holding space capable of holding at least an electronic device, a first heat dissipation unit is disposed at the front of the electronic, the lower part of the case is a second holding space capable of holding at least a server, and a second heat dissipation unit may be disposed at one side of the second holding space, such that a plurality of servers, electronic devices and heat dissipation units may be integrated into the server device for easily and conveniently being moved.

26 Claims, 6 Drawing Sheets

U.S. PATENT DOCUMENTS

| | | | | |
|---|---|---|---|---|
| 6,137,684 | A * | 10/2000 | Ayd et al. | 361/727 |
| 6,147,862 | A * | 11/2000 | Ho | 361/679.32 |
| 6,181,552 | B1 * | 1/2001 | Neville et al. | 361/679.6 |
| 6,246,576 | B1 * | 6/2001 | Sands et al. | 361/679.02 |
| 6,268,664 | B1 * | 7/2001 | Rolls et al. | 307/32 |
| 6,272,016 | B1 * | 8/2001 | Matonis et al. | 361/716 |
| 6,297,950 | B1 * | 10/2001 | Erwin | 361/679.49 |
| 6,331,933 | B1 * | 12/2001 | Rumney | 361/622 |
| 6,351,381 | B1 * | 2/2002 | Bilski et al. | 361/695 |
| 6,421,215 | B1 * | 7/2002 | Bushue | 361/93.1 |
| 6,452,794 | B1 * | 9/2002 | Rumney | 361/679.4 |
| 6,466,448 | B1 * | 10/2002 | Baik | 361/752 |
| 6,504,717 | B1 * | 1/2003 | Heard | 361/695 |
| 6,544,311 | B1 * | 4/2003 | Walton et al. | 55/385.6 |
| 6,560,114 | B2 * | 5/2003 | Berry et al. | 361/727 |
| 6,594,148 | B1 * | 7/2003 | Nguyen et al. | 361/695 |
| 6,621,708 | B1 * | 9/2003 | Sparkes et al. | 361/752 |
| 6,781,843 | B2 * | 8/2004 | Liu et al. | 361/726 |
| 6,785,133 | B2 * | 8/2004 | Barringer et al. | 361/694 |
| 6,826,456 | B1 * | 11/2004 | Irving et al. | 700/299 |
| 6,961,248 | B2 * | 11/2005 | Vincent et al. | 361/796 |
| 7,054,155 | B1 * | 5/2006 | Mease et al. | 361/695 |
| 7,068,498 | B2 * | 6/2006 | Bolich et al. | 361/752 |
| 7,106,596 | B1 * | 9/2006 | Reznikov | 361/724 |
| 7,154,748 | B2 * | 12/2006 | Yamada | 361/690 |
| 7,173,817 | B2 * | 2/2007 | Wei | 361/679.48 |
| 7,184,261 | B2 * | 2/2007 | Chung | 361/679.56 |
| 7,542,300 | B1 * | 6/2009 | Lui et al. | 361/755 |
| 2003/0039099 | A1 * | 2/2003 | Chen | 361/727 |
| 2003/0206398 | A1 * | 11/2003 | Stamos et al. | 361/686 |
| 2004/0240177 | A1 * | 12/2004 | Suzuki et al. | 361/695 |
| 2005/0174743 | A1 * | 8/2005 | Downing et al. | 361/725 |
| 2007/0001560 | A1 * | 1/2007 | Chen et al. | 312/223.2 |
| 2007/0223201 | A1 * | 9/2007 | Fujiya et al. | 361/727 |
| 2007/0223204 | A1 * | 9/2007 | Makabe | 361/756 |
| 2008/0239649 | A1 * | 10/2008 | Bradicich et al. | 361/683 |
| 2008/0310097 | A1 * | 12/2008 | Sherrod et al. | 361/686 |
| 2008/0316699 | A1 * | 12/2008 | Chen et al. | 361/686 |
| 2009/0147459 | A1 * | 6/2009 | Nguyen et al. | 361/679.31 |

* cited by examiner

SERVER DEVICE

FIELD OF THE INVENTION

The present invention relates to a server device, more particularly to a server device for integrating a plurality of servers, electronic devices and heat dissipation units into one place and enabling a user to move the server device easily and conveniently.

BACKGROUND OF THE INVENTION

The world today is a world of progressing information technology where computers (such as personal computers and notebooks etc.) are utilized to handle daily affairs by either enterprises or individuals. As communication technology is fully developed, the traditional regional business model has been replaced by transnational E-Commerce, and E-Business has become an unstoppable trend that personal computers are incapable of fulfilling business needs. Thus computer companies have developed various specialized servers (such as firewall server, switch and router etc.) to solve the problems accompanying E-business.

To hold said devices, racks are adopted by IT personnel of enterprises. Please refer to FIG. 1, a rack 1 has a shape of rectangle wherein a movable door 11 is disposed at the front and within the rack 1 is a holding space 13. Pairs of slots 131 in transverse direction are disposed at both sides of the holding space 13 for holding at least a partition 15 within the holding space 13 which divides the holding space 13 into a plurality of parts and enables IT personnel to place a plurality of servers 18 or other electronic devices (such as display, switch and router etc.) one on top of another in the holding space 13 so as to fully utilize the space of the computer facility. However, the rack 1 has following shortcomings:

1. The servers 18 and other electronic devices will heat up when running. Because their cooling measures are different from each other, interference with cooling is caused which will lead to damage to the components of the servers 18, stopping operation of the servers which results in a loss to the company.

2. The rack 1 is heavy and occupies considerable space that when IT personnel plans to rearrange the computer facility, it is not an easy task to move the rack 1 and there's a high possibility the servers 18 within the rack 1 are damaged during relocation due to collisions with the inner walls of the rack 1.

3. A plurality of openings are disposed at the back of the rack 1 (not shown) for the power lines of the servers 18 (not shown) to pass through that when relocating the servers 18, the IT personnel are forced to move the rack 1 before connecting or disconnecting the power lines which is very inconvenient.

To get rid of above shortcomings, open racks are adopted to hold the servers 18. Please refer to FIG. 2, the rack 2 comprises a first frame 22 which has a rectangle shape and is placed on the ground. Four poles 24 are disposed at four corners of the first frame 22, extend in the direction away from the ground, and are coupled with a rectangle-shape second frame 26 at its four corners thus enables the IT personnel to screw the servers 18 onto the rack 2 for easy management. However, there are still certain shortcomings of the rack 2 as follows:

1. The rack 2 is composed of a plurality of metal poles, making an open space so that dust or other particles will be accumulated on the servers 18 over a period of time which has a bad influence on the normal operation of the servers 18.

2. When relocating the rack 2, because the servers 18 are exposed, first the servers 18 need to be removed from the rack 2, then moved to a predetermined location and installed on another rack 2 which will cost the IT personnel lots of time and efforts on setting, adjustment and repeated removal and installation of the servers 18.

According to above description, it may be recognized that there are still certain problems concerning practical use of the racks 1 and 2. Hence, to develop a device capable of holding all kinds of servers, electronic devices and related apparatuses to solve above problems has become an important issue for all computer companies and designers.

SUMMARY OF THE INVENTION

For the purpose of solving that arise because, for example, a conventional rack for holding servers and electronic devices is hard to move, has poor heat dissipation capability, may have a good chance of dust accumulation and difficulty in maintenance, the inventor has after much research and experimentation developed a server device of the present invention.

The present invention relates to a server device which comprises a case wherein two symmetric slots are disposed on the top of the case and a first handle is disposed in each of the slots to make it easier to lift up the server device. A horizontal partition is disposed in the case and divides the inner space of the case into upper and lower parts wherein the upper part is a first holding space capable of holding at least an electronic device (such as a power supplier or hard disk etc.). A first heat dissipation unit (such as a fan) is disposed at the front of the electronic device and a second handle is pivotally coupled to the front of the electronic device near one side wherein a plurality of first heat dissipation holes are disposed on the second handle and the second handle covers the first heat dissipation unit. The lower part of the case is a second holding space capable of holding at least a server wherein a drawing bar is disposed at one side of the server for pulling the server out of the second holding space or fixing the server. A second heat dissipation unit may be disposed at one side of the second holding space wherein a third handle is disposed at the end of the second heat dissipation unit not inside of the case which may be used to pull the second heat dissipation unit out of the second holding space. In the case that the computer facility needs to be rearranged, a plurality of servers and electronic devices may be moved to a predetermined location easily instead of removing them from the rack, moving them to the predetermined location, and installing them on another rack thus substantially saves time and efforts on installation, setting and adjustment.

Another objective of the present invention is that the servers, electronic devices and heat dissipation units etc. are all placed within the case which keeps dust from being accumulated on said devices and prevents business from being interrupted due to abnormal operation. A first filter may be disposed at the side of the second handle facing the first heat dissipation unit for preventing dust or other particles from being sucked into the electronic device to increase the lives of the first heat dissipation unit and the electronic device. Besides, a filter may be disposed at the air inlet of the case (i.e. one side of the case) for preventing dust or other particles from being sucked into the server to increase the lives of the second heat dissipation unit and the server. Moreover, utilization of the first and second heat dissipation units may prevent the operation of the server from being interfered due to over-heated.

Another objective of the present invention is that a plurality of servers and electronic devices of multiple departments may be systematically placed within a server device that when servers and electronic devices of certain departments need to be relocated, upgraded or replaced, the operation of other departments will remain unaffected.

BRIEF DESCRIPTION OF THE DRAWINGS

The foregoing aspects, as well as many of the attendant advantages and features of the present invention will become more apparent by reference to the following detailed description, when taken in conjunction with the accompanying drawings, wherein.

DETAILED DESCRIPTION OF THE PREFERRED EMBODIMENT

Figure 1:
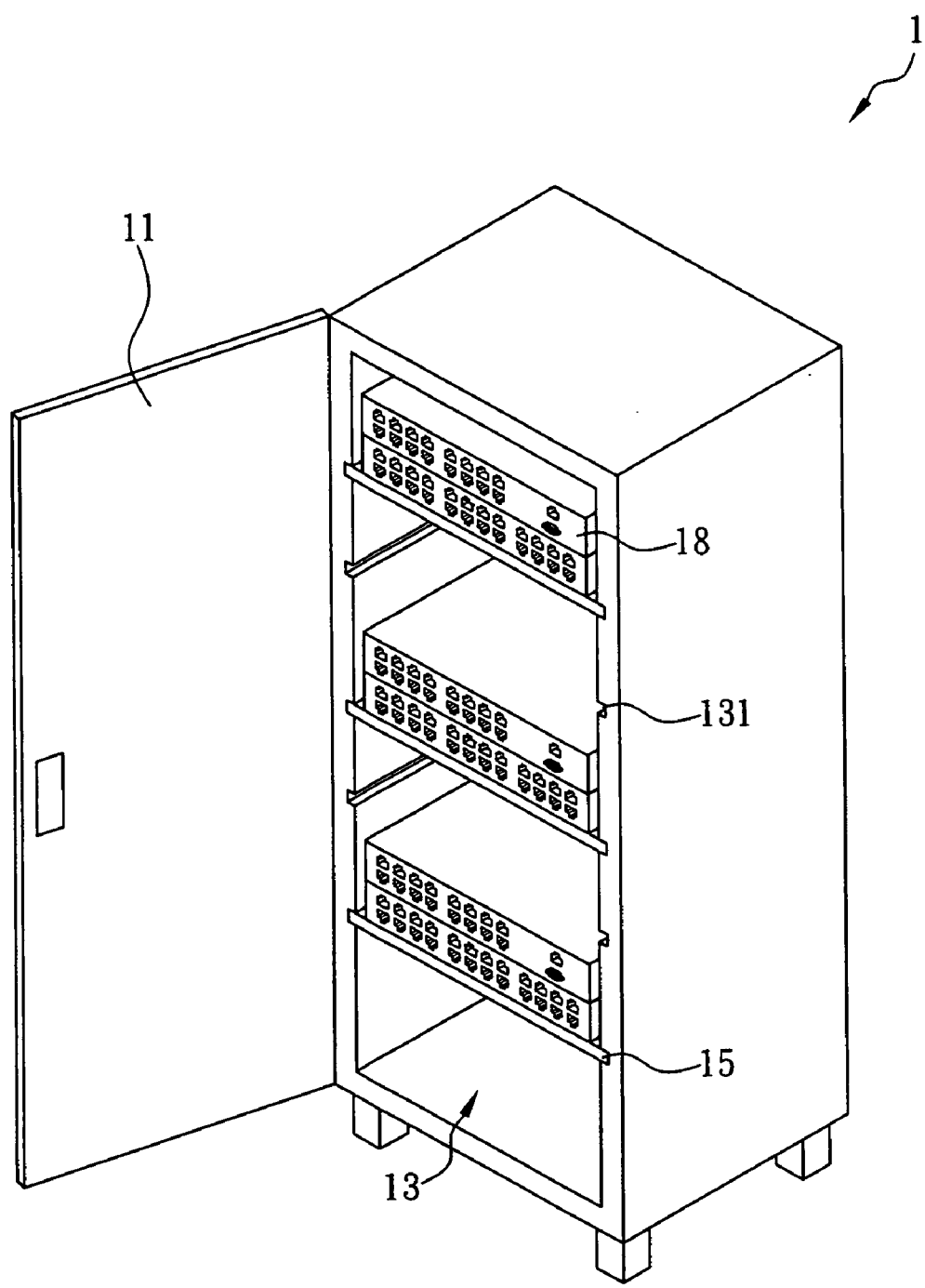
FIG. 1 shows a conventional rack.
Figure 2:
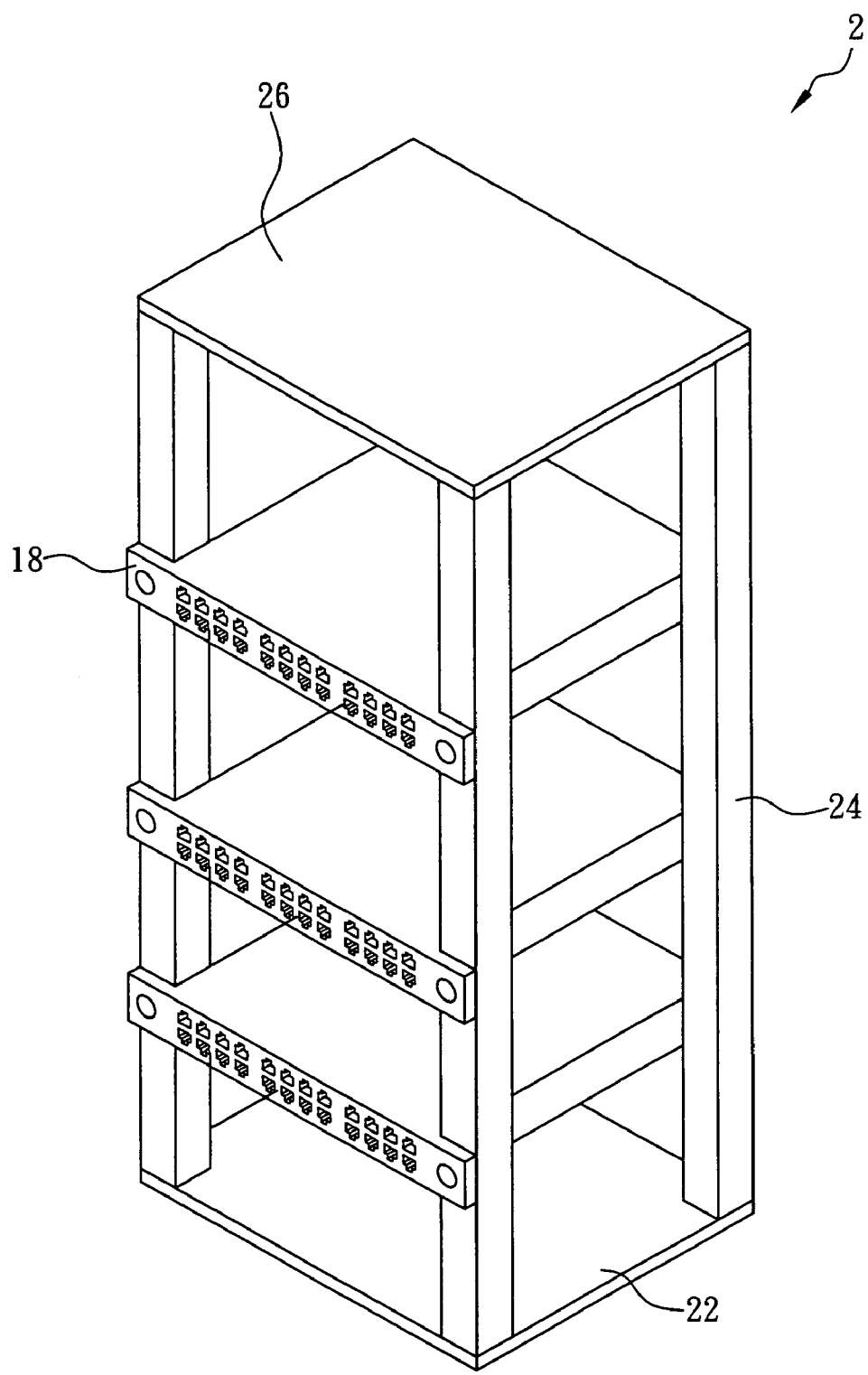
FIG. 2 shows another conventional rack.
Figure 3:
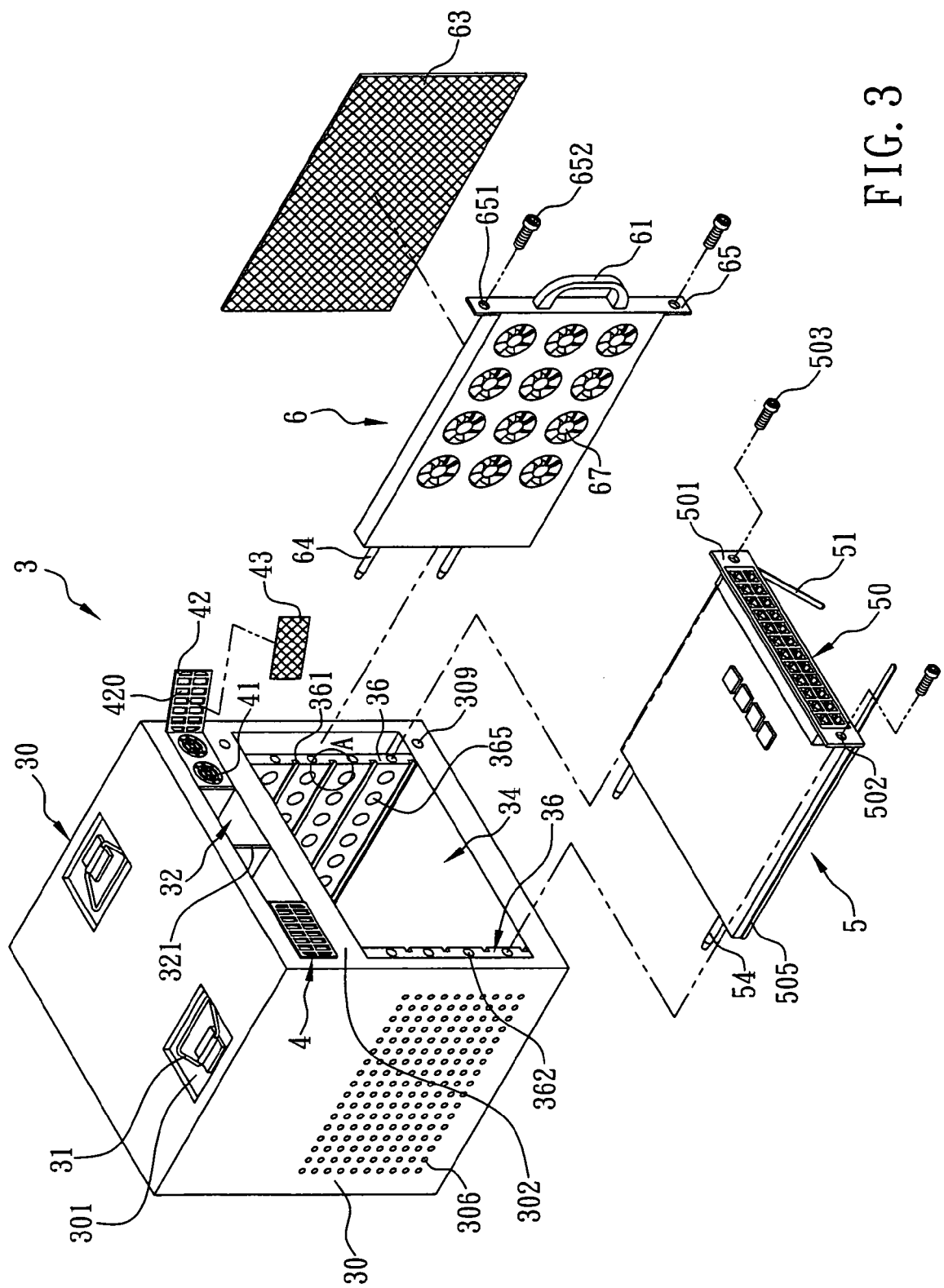
FIG. 3 shows a server device of a preferred embodiment of the present invention.

Please refer to FIG. 3, the present invention relates to a server device. The server device 3 comprises a case 30 wherein two symmetric slots 301 are disposed on the top of the case 30 and a first handle 31 is disposed in each of the slots 301 respectively. A horizontal partition 302 divides the inner space of the case 30 into a first holding space 32 and a second holding space 34 wherein the first holding space 32 is capable of holding at least an electronic device 4 (such as a power supplier or hard disk etc.). A first heat dissipation unit 41 and a second handle 42 are disposed at the front of the electronic device 4 wherein the second handle 42 is pivotally coupled to the front of the electronic device 4 near one side and covers the first heat dissipation unit 41, and a plurality of first heat dissipation holes 420 are disposed on the second handle 42. The second holding space 34 is capable of holding at least a server 5 wherein a drawing bar 51 is disposed at one side of the server 5 for pulling the server 5 out of the second holding space 34. A second heat dissipation unit 6 may be disposed at one side of the second holding space 34 wherein a third handle 61 is disposed at the end of the second heat dissipation unit 6 not inside of the case 30 and may be used to pull the second heat dissipation unit 6 out of the second holding space 34 or make the second heat dissipation unit 6 be fixed in the second holding space 34. Thus, a plurality of servers 5 and electronic devices 4 of multiple departments may be systematically placed within the server device 3 that in the case the computer facility needs to be rearranged, moving said servers 5 and electronic devices 4 to a predetermined location will be an easy task.

Please refer to FIG. 3, in above preferred embodiment of the present invention, the first holding space 32 is capable of holding four electronic devices 4 while the second holding space 34 is capable of holding four servers 5. However, allocation of the space within the server device 3 may be adjusted according to actual needs during practical use instead of being limited to the preferred embodiment stated above. Two symmetric slots 301 are disposed on the top of the case 30 near the edges and the first handle 31 is disposed in each of the slots 301 respectively wherein each of the first handles 31 is pivotally coupled to one side of the corresponding slot 301 for easy lift-up and relocation of the server device 3. The horizontal partition 302 is disposed within the case 30 and divides the inner space of the case 30 into the first holding space 32 and the second holding space 34 wherein the first holding space 32 is on the top of the second holding space 34. The first holding space 32 is capable of horizontally holding four electronic devices 4 and a vertical partition 321 is disposed between each pair of adjacent electronic devices 4 that each vertical partition 321 will be closely against one side of each adjacent electronic device 4 so as to make the electronic devices 4 be fixed within the first holding space 32 and prevent them from leaving their original locations during movement of the server device 3 due to the first holding space 32 is not fully occupied.

Figure 4:
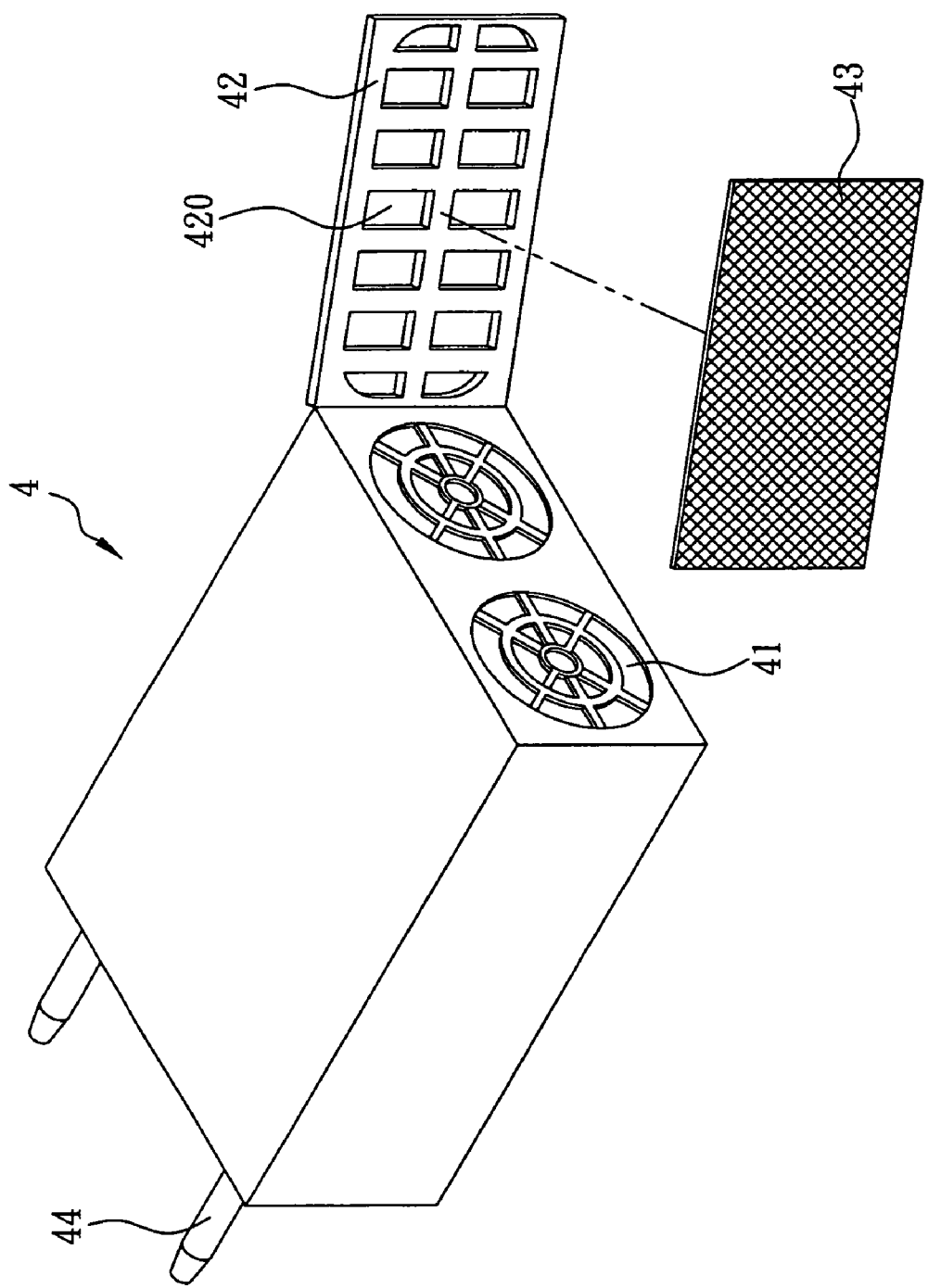
FIG. 4 shows an electronic device.

Please refer to FIGS. 3 and 4, two first heat dissipation units 41 (fans in the present embodiment) are disposed at the front of the electronic device 4 which are capable of bringing in cold air from the outside to cool down the electronic device 4. The second handle 42 is pivotally coupled to the front of the electronic device 4 near one side which may cover the first heat dissipation unit 41 thus prevents the second handle 42 from being damaged during movement of the server device 3. A plurality of first heat dissipation holes 420 are disposed on the second handle 42 which enable cold air to be brought in from the outside while the first heat dissipation unit 41 is covered by the second handle 42. Two first metal poles 44 of foolproof design are disposed at the side of the electronic device 4 away from the first heat dissipation unit 41 and extend in the direction away from the first heat dissipation unit 41 which prevent the electronic device 4 from being mounted to the server device 3 in the case that the electronic device 4 is not correctly handled so as to insure normal operation of the electronic device 4.

Please refer to FIG. 3, the second holding space 34 is capable of vertically holding four servers 5. Two symmetric holders 36 are disposed within the second holding space 34 wherein a plurality of sliding slots 361 are disposed at the side of each of the holders 36 facing the server 5 for engagement with both ends of the server 5. A plurality of fixing holes 362 are disposed at one end of each of the holders 36 near the sliding slots 361, and the sliding slots 361 and fixing holes 362 of one holder 36 correspond to the sliding slots 361 and fixing holes 362 of the other holder 36. A panel 50 is disposed at the front of the server 5 wherein a first fixing plate 501 is disposed at each of the two ends of the panel 50 and each of the first fixing plates 501 comprises a locking hole 502. A protruded bar 505 is disposed at each of the two sides of the server 5 near the panel 50. Please refer to FIG. 3, when the server 5 is installed in the server device 3 and each of the protruded bars 505 is engaged with corresponding sliding slot 361, each of the locking holes 502 will correspond to a fixing hole 362 thus the server 5 may be fixed within the second holding space 34 by using a plurality of screws 503. Besides, two second metal poles 54 of foolproof design are disposed at the end of the server 5 away from the panel 50 and extend in the direction away from the panel 50 which prevent the server 5 from being mounted to the server device 3 with incorrect direction so as to insure normal operation of the server 5.

Figure 5:
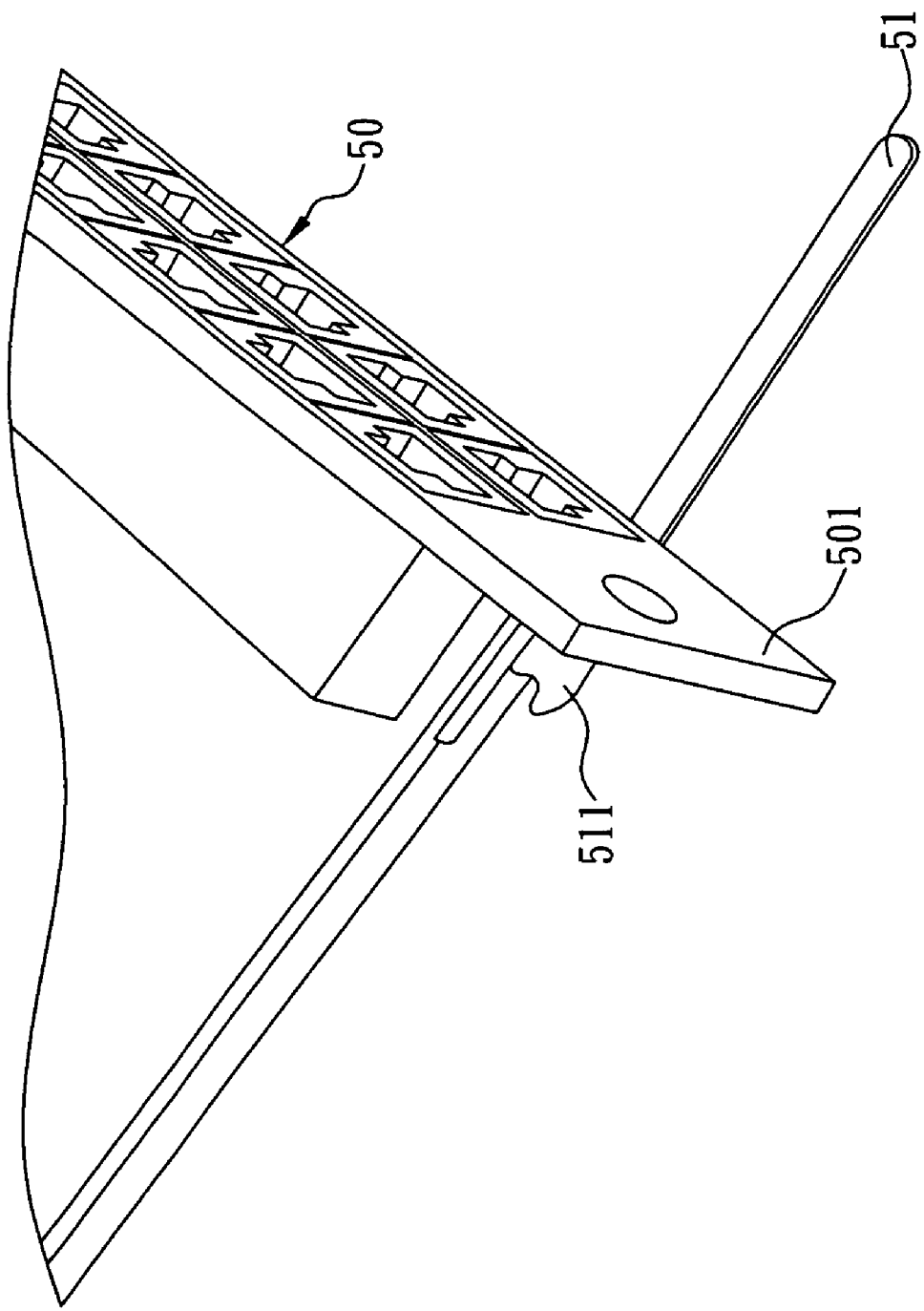
FIG. 5 shows a partial view of a server.

Please refer to FIGS. 3 and 5, a drawing bar 51 is pivotally coupled to each of the two ends of the panel 50 near the first fixing plate 501 wherein the drawing bars 51 are attached to the panel 50 that when the user intends to pull out the server 5, the end not pivotally coupled to the panel 50 of each of the drawing bars 51 may be pulled away from the panel 50 thus makes the drawing bars 51 be perpendicular to the panel 50, and two pressing plates 511 will stick out from the pivotal junctions of the drawing bars 51 and push the holders 36 thus part the server 5 from the second holding space 34 and enable the user to pull out the server 5 from the second holding space 34 easily.

Figure 6:
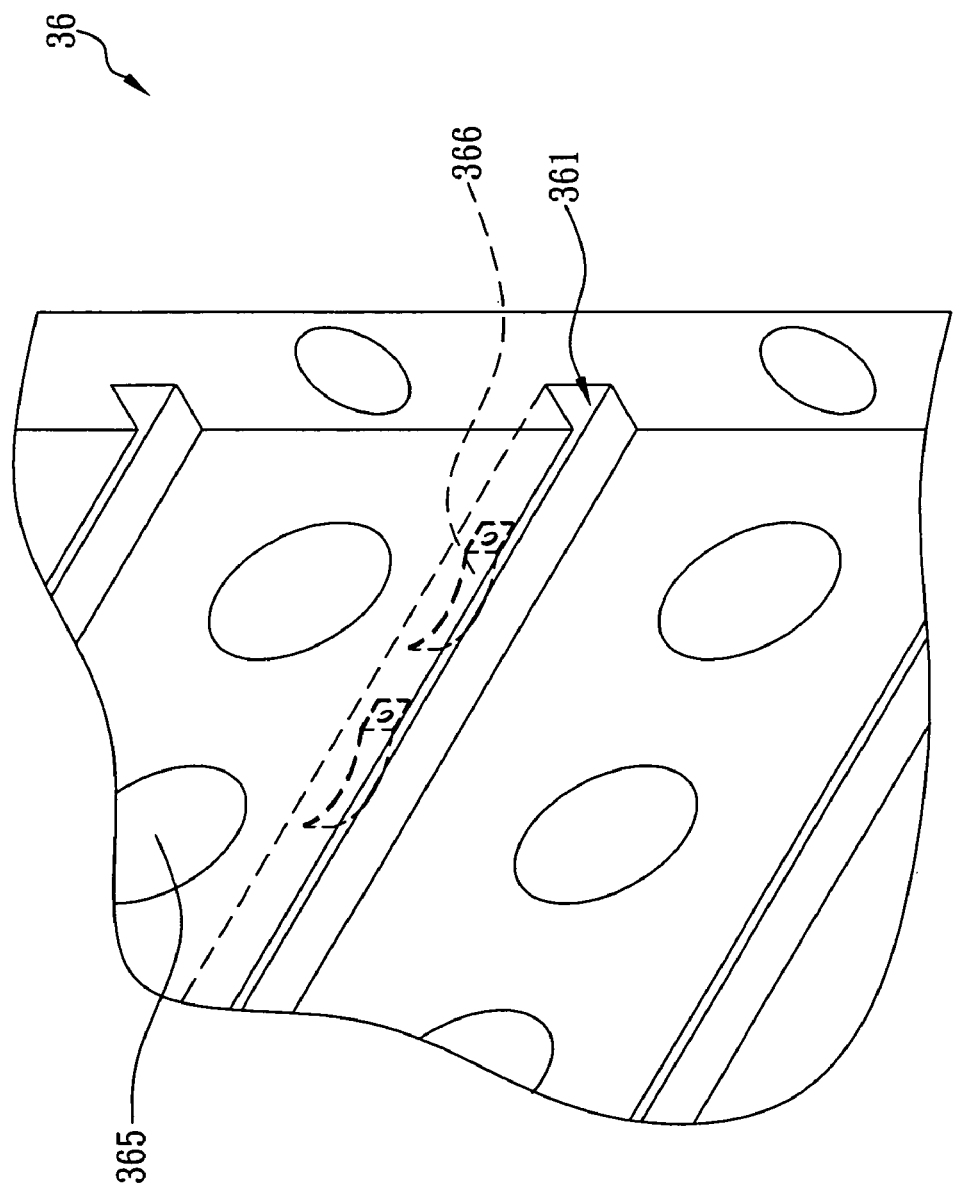
FIG. 6 shows a partially enlarged view (marked A).

Please refer to FIGS. 3 and 6, a plurality of openings 365 are disposed on each of the holders 36 for air circulation. Please refer to partially enlarged view marked A in FIG. 6, a bracket 366 is disposed in each slot 361 of each of the holders 36 every a predetermined distance that when the protruded bars 505 of the server 5 are engaged with the sliding slots 361, the brackets 366 will have close contact with the protruded bars 505 thus keeps the server 5 from shaking during relocation of the server device 3. Besides, due to the brackets 366 keep contact with the protruded bars 505, there will be a grounding effect between the server 5 and the holders 36 which may prevent the server device 3 from electro-magnetic interference.

Please refer to FIG. 3, a second heat dissipation unit 6 may be disposed at the side of the second holding space 34 away from the server 5 wherein a third handle 61 is disposed at the outward side of the second heat dissipation unit 6 for pulling the second heat dissipation unit 6 out of the second holding space 34. A second fixing plate 65 is disposed at each of the two ends of the outward side of the second heat dissipation unit 6 where the third handle 61 is disposed, and a first positioning hole 651 is disposed on each of the second fixing plates 65. Second positioning holes 309 are disposed on the case 30 at the locations corresponding to the first positioning holes 651 that the user may fix the second heat dissipation unit 6 in the case 30 by using second screws 652. A plurality of fans 67 are disposed in the second heat dissipation unit 6 which may be used to expel hot air generated during operation of the server 5. Two third metal poles 64 of foolproof design are disposed at the side of the second heat dissipation unit 6 away from the third handle 61 and extend in the direction away from the third handle 61 which prevent the second heat dissipation unit 6 from being mounted to the server device 3 with incorrect direction so as to insure normal operation of the second heat dissipation unit 6.

In other embodiments of the present invention, said foolproof design is not limited to two metal poles but may be more than two metal poles or other structures or measures such as giving different colors to the areas on the holders 36 corresponding to the locations of the servers 5 and marking colors on the side of the second heat dissipation unit 6 where the third handle 61 is disposed with the same colors as those on the holders 36 to enable the user to easily recognize the proper direction when installing the second heat dissipation unit 6. Thus, any design capable of preventing incorrect installation of any device in the server device 3 should be regarded as the foolproof design of the present invention.

Please refer to FIG. 3, a plurality of second heat dissipation holes 306 are disposed at both sides of the case 30 at the areas near the second holding space 34 which enable air to flow in through the second heat dissipation holes 306 disposed at the side of the case 30 near the second heat dissipation unit 6 (in FIG. 3, only the second heat dissipation holes 306 disposed at the other side are shown) when the server device 3 is in use and hot air generated by the servers 5 to flow out through the second heat dissipation holes 306 disposed at the other side thus keep air circulation and prevent the operation of the server device 3 from being interfered due to high temperature in the case 30.

Please refer to FIG. 3, it should be noted that the amount of the locking hole 502, protruded bar 505 of the server 5 and the first position hole 651 of the second heat dissipation unit 6 may be decided according to actual needs during implementation instead of being limited to the amount stated in above embodiments. Besides, it may be designed in such a way that the first screws 503 and the second screws 652 remain in the locking holes 502 and the first positioning holes 651 while the server 5 or the second heat dissipation unit 6 is removed from the server device 3 to prevent loss of said screws.

Please refer to FIGS. 3 and 4, in other embodiments of the present invention, a first filter 43 may be disposed at the side of the second handle 42 facing the first heat dissipation unit 41 for preventing dust or other particles from being sucked into the electronic device 4 to increase the lives of the first heat dissipation unit 41 and the electronic device 4. Besides, a filter 63 may be disposed at the side of the second heat dissipation unit 6 away from the server 5 for preventing dust or other particles from being sucked into the server 5 to increase the lives of the second heat dissipation unit 6 and the server 5. To be noted, in the case that the first heat dissipation unit 41 and the second heat dissipation unit 6 are used to expel hot air within the case 30, the first filter 43 and the filter 63 will be disposed within the case 30 at the side away from the first heat dissipation unit 41 and the second heat dissipation unit 6 respectively, i.e. where air flows into the case 30, and the first filter 43 and the filter 63 may be changed as needed to allow long-lasting usage of the server device 3.

While the invention herein disclosed has been described by means of specific embodiments, numerous modifications and variations could be made thereto by those skilled in the art without departing from the scope and spirit of the invention set forth in the claims.

What is claimed is:

1. A server device, comprising:

a case, wherein two symmetric slots are disposed on the top of said case, a first handle is disposed in each of said slots respectively, a horizontal partition divides an inner space of said case into a first holding space and a second holding space which is underneath said first holding space, a plurality of second heat dissipation holes are disposed at both sides of said case at areas near said second holding space, two symmetric holders are disposed in said second holding space, a plurality of sliding slots are disposed at the side of each of said holders, a plurality of fixing holes are disposed on each of said holders near one end of each of said sliding slots, said sliding slots and fixing holes of one of said holders correspond to said sliding slots and fixing holes of the other holder, a filter is disposed within said case at the side where said second heat dissipation holes are disposed, and at least a vertical partition is disposed in said first holding space;

at least an electronic device placed in said first holding space, wherein one side of said electronic device is closely against said vertical partition when said electronic device is placed in said first holding space, a first heat dissipation unit is disposed at the front of said electronic device, a second handle is pivotally coupled to the front of said electronic device near one side and covers said first heat dissipation unit, a plurality of first heat dissipation holes are disposed on said second handle, and a plurality of first metal poles of foolproof design are disposed at the side of said electronic device away from said first heat dissipation unit;

at least a server placed in said second holding space, which comprises a panel, two first fixing plates disposed at both ends of said panel respectively that each of said first fixing plates comprises at least a locking hole, and a plurality of protruded bars disposed at two symmetric sides of said server near said panel respectively that, when installing said server in said server device, each of said protruded bars is engaged with one of said sliding slots and each of said locking holes corresponds to one of said fixing holes which allows a plurality of first screws to pass through said locking holes and fixing holes thus making said server be fixed in said second holding space, wherein a drawing bar is pivotally coupled to one side of said server for pulling said server out of said second holding space; and a second heat dissipation unit disposed at one side of said second holding space, wherein a third handle is disposed at an outward side of said second heat dissipation unit.

2. A server device of claim 1 wherein one end of said drawing bar is pivotally coupled to the end of said panel near one of said first fixing plates and a pressing plate is disposed at said end that when said drawing bar is pulled away from said panel, said pressing plate sticks out from the pivotal junction of said drawing bar and push said holders so as to slightly part said server from said second holding space.

3. A server device of claim 2 wherein a plurality of second metal poles of foolproof design are disposed at the side of said server away from said panel.

4. A server device of claim 3 wherein a plurality of brackets are disposed in each of said sliding slots, every two of said brackets adjacent to each other are spaced a predetermined distance apart that when said protruded bars of said server are engaged with said sliding slots, said brackets have contact with said protruded bars.

5. A server device of claim 4, wherein a plurality of openings are disposed on each of said holders.

6. A server device of claim 5 wherein said second heat dissipation unit comprises a second fixing plate at each of the two ends of its outward side, a first positioning hole is disposed on each of said second fixing plates, and a second positioning hole is disposed on said case at the location corresponding to each of said first positioning holes that when installing said second heat dissipation unit, a second screw passes through each of said first positioning holes and corresponding second positioning hole thus making said second heat dissipation unit be fixed in said case.

7. A server device of claim 6 wherein a plurality of third metal poles of foolproof design are disposed on said second heat dissipation unit at the side away from said third handle.

8. A server device of claim 6 wherein the areas on each of said holders corresponding to different servers are marked different colors, and the side of said second heat dissipation unit where said third handle is disposed is marked colors corresponding to those on each of said holders.

9. A server device of claim 6 wherein a first filter may be disposed at the side of said second handle facing said first heat dissipation unit.

10. A server device of claim 5 wherein a second fixing plate is disposed on said second heat dissipation unit at each of the two ends of its outward side, each of said second fixing plates comprises a first positioning hole and a second screw disposed in said first positioning hole, and a second positioning hole is disposed on said case at the location corresponding to each of said first positioning holes that when installing said second heat dissipation unit, each of said second screws passes through a corresponding second positioning hole thus making said second heat dissipation unit be fixed in said case.

11. A server device of claim 10 wherein a plurality of third metal poles of foolproof design are disposed on said second heat dissipation unit at the side away from said third handle.

12. A server device of claim 10 wherein the areas on each of said holders corresponding to different servers are marked different colors, and the side of said second heat dissipation unit where said third handle is disposed is marked colors corresponding to those on each of said holders.

13. A server device of claim 10 wherein a first filter may be disposed at the side of said second handle facing said first heat dissipation unit.

14. A server device, comprising:

a case, wherein two symmetric slots are disposed on the top of said case, a first handle is disposed in each of said slots respectively, a horizontal partition divides an inner space of said case into a first holding space and a second holding space which is underneath said first holding space, a plurality of second heat dissipation holes are disposed at both sides of said case at areas near said second holding space, two symmetric holders are disposed in said second holding space, a plurality of sliding slots are disposed at the side of each of said holders, a plurality of fixing holes are disposed on each of said holders near one end of each of said sliding slots, said sliding slots and fixing holes of one of said holders correspond to said sliding slots and fixing holes of the other holder, a filter is disposed within said case at the side where said second heat dissipation holes are disposed, and at least a vertical partition is disposed in said first holding space;

at least an electronic device placed in said first holding space, wherein one side of said electronic device is closely against said vertical partition when said electronic device is placed in said first holding space, a first heat dissipation unit is disposed at the front of said electronic device, a second handle is pivotally coupled to the front of said electronic device near one side and covers said first heat dissipation unit, a plurality of first heat dissipation holes are disposed on said second handle, and a plurality of first metal poles of foolproof design are disposed at the side of said electronic device away from said first heat dissipation unit;

at least a server placed in said second holding space, which comprises a panel, two first fixing plates disposed at both ends of said panel respectively that each of said first fixing plates comprises at least a locking hole and at least a first screw disposed in said locking hole, and a plurality of protruded bars disposed at two symmetric sides of said server near said panel respectively that, when installing said server in said server device, each of said protruded bars is engaged with one of said sliding slots and each of said locking holes corresponds to one of said fixing holes which allows each of said first screws to pass through corresponding fixing hole thus making said server be fixed in said second holding space, wherein a drawing bar is pivotally coupled to one side of said server for pulling said server out of said second holding space; and a second heat dissipation unit disposed at one side of said second holding space, wherein a third handle is disposed at an outward side of said second heat dissipation unit.

15. A server device of claim 14, wherein one end of said drawing bar is pivotally coupled to the end of said panel near one of said first fixing plates and a pressing plate is disposed at said end that when said drawing bar is pulled away from said panel, said pressing plate sticks out from the pivotal junction of said drawing bar and push said holders so as to slightly part said server from said second holding space.

16. A server device of claim 15, wherein a plurality of second metal poles of foolproof design are disposed at the side of said server away from said panel.

17. A server device of claim 16, wherein a plurality of brackets are disposed in each of said sliding slots, every two of said brackets adjacent to each other are spaced a predetermined distance apart that when said protruded bars of said server are engaged with said sliding slots, said brackets have contact with said protruded bars.

18. A server device of claim 17, wherein a plurality of openings are disposed on each of said holders.

19. A server device of claim 18, wherein said second heat dissipation unit comprises a second fixing plate at each of the two ends of its outward side, a first positioning hole is disposed on each of said second fixing plates, and a second positioning hole is disposed on said case at the location corresponding to each of said first positioning holes that when installing said second heat dissipation unit, a second screw passes through each of said first positioning holes and corresponding second positioning hole thus making said second heat dissipation unit be fixed in said case.

20. A server device of claim 19, wherein a plurality of third metal poles of foolproof design are disposed on said second heat dissipation unit at the side away from said third handle.

21. A server device of claim 19, wherein the areas on each of said holders corresponding to different servers are marked different colors, and the side of said second heat dissipation unit where said third handle is disposed is marked colors corresponding to those on each of said holders.

22. A server device of claim 19, wherein a first filter may be disposed at the side of said second handle facing said first heat dissipation unit.

23. A server device of claim 18, wherein a second fixing plate is disposed on said second heat dissipation unit at each of the two ends of its outward side, each of said second fixing plates comprises a first positioning hole and a second screw disposed in said first positioning hole, and a second positioning hole is disposed on said case at the location corresponding to each of said first positioning holes that when installing said second heat dissipation unit, each of said second screws passes through a corresponding second positioning hole thus making said second heat dissipation unit be fixed in said case.

24. A server device of claim 23, wherein a plurality of third metal poles of foolproof design are disposed on said second heat dissipation unit at the side away from said third handle.

25. A server device of claim 23, wherein the areas on each of said holders corresponding to different servers are marked different colors, and the side of said second heat dissipation unit where said third handle is disposed is marked colors corresponding to those on each of said holders.

26. A server device of claim 23, wherein a first filter may be disposed at the side of said second handle facing said first heat dissipation unit.

* * * * *